(12) United States Patent
Petrulionis et al.

(10) Patent No.: US 11,588,294 B2
(45) Date of Patent: Feb. 21, 2023

(54) ARBITRARY CONTROL OF AMPLITUDE, POLARIZATION AND PHASE OF LIGHT IN PULSED LASER SYSTEMS

(71) Applicant: UAB Light Conversion, Vilnius (LT)

(72) Inventors: Dalius Petrulionis, Vieciunai (LT); Darius Grigaitis, Vilnius (LT)

(73) Assignee: UAB Light Conversion, Vilnius (LT)

( * ) Notice: Subject to any disclaimer, the term of this patent is extended or adjusted under 35 U.S.C. 154(b) by 413 days.

(21) Appl. No.: 16/828,640

(22) Filed: Mar. 24, 2020

(65) Prior Publication Data

US 2020/0313383 A1    Oct. 1, 2020

(30) Foreign Application Priority Data

Apr. 1, 2019  (EP) .................................... 19166439

(51) Int. Cl.
| | |
|---|---|
| *H01S 3/11* | (2006.01) |
| *H01S 3/107* | (2006.01) |
| *G02F 1/03* | (2006.01) |
| *H01S 3/00* | (2006.01) |

(52) U.S. Cl.
CPC .............. *H01S 3/11* (2013.01); *G02F 1/0327* (2013.01); *H01S 3/107* (2013.01); *H01S 3/0085* (2013.01)

(58) Field of Classification Search
CPC .......... H01S 3/11; H01S 3/107; H01S 3/0085; G02F 1/0327
See application file for complete search history.

(56) References Cited

U.S. PATENT DOCUMENTS

| | | | | |
|---|---|---|---|---|
| 4,620,113 A | * | 10/1986 | Sizer, II ................ | G02F 1/0327 327/183 |
| 5,157,451 A | * | 10/1992 | Taboada .................. | G01S 7/499 348/262 |
| 5,204,867 A | * | 4/1993 | Koschmann ............ | H01S 3/136 372/38.03 |

(Continued)

FOREIGN PATENT DOCUMENTS

| | | | | |
|---|---|---|---|---|
| DE | 102009006154 A1 | * | 7/2010 | ........... G02F 1/0327 |
| DE | 102014111774 A1 | * | 2/2016 | ......... B23K 26/0622 |

(Continued)

*Primary Examiner* — Peter Radkowski
(74) *Attorney, Agent, or Firm* — Shannon K Stauffer

(57) ABSTRACT

Disclosed is a system for arbitrary control of amplitude, phase and polarization characteristics of light in pulsed laser systems, allowing fast pulse-to-pulse modification of the above-mentioned parameters for single pulses or arbitrarily long and closely-spaced bursts of pulses. The control uses an electro-optic device, driving it by a specially designed high voltage driver. The operation of the driving electronics is based on the precise control of charging and discharging a Pockels cell inherent capacitance. This inherent capacitance is typically considered as parasitic. Therefore, prior voltage drivers operate in spite of the capacitance instead of using it. The present high voltage driver consists of a multitude of current-controlled stages capable of sinking and sourcing specific and adjustable currents into the capacitive load of the Pockels cell. The disclosed device and the corresponding control method allow for precise and energy-efficient shaping of Pockels cell control voltage.

15 Claims, 7 Drawing Sheets

(56) References Cited

U.S. PATENT DOCUMENTS

| | | | | |
|---|---|---|---|---|
| 5,343,483 A * | 8/1994 | Farrell | ............... | H01S 3/115 372/38.1 |
| 7,649,667 B2 * | 1/2010 | Bergmann | ............ | G02F 1/0327 359/245 |
| 8,536,929 B2 * | 9/2013 | Bergmann | ............ | H01S 3/107 327/427 |
| 9,787,218 B2 * | 10/2017 | Yamagishi | ............ | G02F 1/0327 |
| 2017/0237221 A1 * | 8/2017 | Dolkemeyer | ............ | H01S 3/11 372/25 |

FOREIGN PATENT DOCUMENTS

| | | | | |
|---|---|---|---|---|
| EP | 1801635 A1 * | 6/2007 | ............ | G02F 1/0327 |
| EP | 2775619 A1 | 9/2014 | | |
| RU | 120297 U1 * | 9/2012 | | |
| WO | WO-2013065387 A1 * | 5/2013 | ............ | G02F 1/0327 |
| WO | 2016026484 A2 | 2/2016 | | |

\* cited by examiner

ARBITRARY CONTROL OF AMPLITUDE, POLARIZATION AND PHASE OF LIGHT IN PULSED LASER SYSTEMS

REFERENCES

1. Bergmann et al. 2010. Controlling Pockels cells. U.S. Pat. No. 7,649,667B2/US2008018977.
2. Bergmann, 2013, High Voltage Switch With Adjustable Current, U.S. Pat. No. 8,536,929B2.
3. Yamagishi Shogo et al. HAMAMATSU, 2017. Capacitive load driving circuit. Patent EP2775619/U.S. Pat. No. 9,787,218B2.
4. Dolkemeyer et al. AMPHOS GMBG, 2016. System and method for modulating laser pulses. Patent application WO2016026484(A2)/US20170237221(A1).

FIELD OF INVENTION

This application relates to control of amplitude, polarization and phase characteristics of light in pulsed laser systems. More specifically, it relates to driving methods and driver systems, applicable to control of electro-optic devices (Pockels cells). The particular design of the Pockels cell driver utilising a plurality of current sources enables the driver to control light parameters such as amplitude, polarization and phase in order to manipulate light in pulsed laser systems.

BACKGROUND ART

Utilization of lasers has become essential in many areas of industry, science and medicine. Various techniques employing laser light in a wide range of applications are under intensive development, ranging from micro-machining, photo-polymerization, different medical applications and microscopy to a multitude of cutting-edge research fields.

Advantages of laser-assisted welding, cutting and marking over conventional mechanical techniques for industrial applications include high speed and precision, allowing for simple or no post-processing of the material. This is especially convenient for material removal or modification processes in the printing industry, for perforation of films and substrates, and many other industrial processes.

Most of the above-mentioned applications share a typical structure where a pulsed laser beam is provided by means of a laser source, with the individual pulses of the laser beam being modulated according to the requirements of the corresponding application.

One of the major problems to be solved in the design of pulsed laser systems is related specifically to the requirements for short switching times of electro-optic switches used to modulate the laser output which are typically Pockels cells. While high repetition rate laser operation with pulse periods of tens of nanoseconds or less is often preferable, the transition time of the electrical circuits controlling individual laser pulses cannot be reduced arbitrarily. This is disadvantageous, particularly, for the modulation of laser pulses in pulsed laser systems such as nanosecond, picosecond and femtosecond lasers. One of the reasons for this is that the high voltage switches themselves require a certain switching time to switch a voltage from some first voltage level to some second voltage level which acts on the Pockels cell to modulate light. In pulsed laser systems the duration of these transitions, also referred to as the "rise" and "fall" times for the leading and trailing edges of the electrical pulse respectively, are often greater than the time interval between two consecutive laser pulses. Because of lengthy transitions, incorrect modulation of an individual or a plurality of laser pulses can occur where modulation signal meant for the first pulse affects the second pulse.

Further advantages are apparent for systems which can support independent pulse-to-pulse setting of laser light parameters during processing. This necessitates that the transition of the Pockels cell control voltage takes place in the time interval between the two pulses and that the voltage is already settled when the second pulse arrives at the modulator. As a result, for pulse-to-pulse modulation to work, whenever a laser pulse interacts with the Pockels cell, the voltage must be settled to some predetermined value.

The U.S. Pat. No. 7,649,667B2 (BERGMANN, 2010) discloses a controllable Pockels cell system which has a switching unit that can apply a voltage to the Pockels cell. The Pockels cell and driver system also features a delay unit that enables setting of a precise time when the voltage is applied or removed from the Pockels cell in relation to the laser pulses. This allows for the voltage pulse applied to the Pockels cell to be shifted in time, also shifting the transmission window of the Pockels cell and analyzer system in a way, that the pulse of light during its interaction with the cell sees some intermediate transient voltage. Thus, it is possible to individually control the amplitude of selected laser pulses. This invention utilizes a voltage-source type Pockels cell driver and takes into account the delays and transition times of the high voltage pulse caused by the capacitance on the Pockels cell electrodes interacting with the driver parasitics (paragraphs [0042], [0051] and [57]). As a result of the transient nature of the voltage during the pulse interaction with the modulator, this invention is applicable only to controlling the amplitude of a single pulse, since even a burst of pulses spaced closely apart in time would experience different voltages, sampled at different instants during the rising or falling voltage transition. Moreover, this method directly converts the time jitter of the control signal with respect to the laser source into amplitude instability at the optical output. In contrast, the invention described in this patent presents a settled voltage level at the time of laser pulse interaction with the modulator. As a result, the described method is sensitive only to the control signal pulse width variation and does not require precise locking of laser and control signal positions in time, significantly reducing modulation uncertainty.

The U.S. Pat. No. 8,536,929 (BERGMANN, 2013) presents a disclosure of a high voltage switch which may comprise a chain of MOS field-effect transistors (MOSFETs). The current of the individual MOSFETs, and hence the chain, can be controlled by means of adding a current measuring resistance into the source path of the transistors and transmitting the voltage arising there via a capacitor to the gate terminal of the transistors. Furthermore, paragraph [0040] and FIG. 1 discloses that "the switching unit 10 substantially comprises a transistor chain made up of N MOS field effect transistors (MOSFETs) (e.g., referred to in the figures as merely TN), which are arranged in series relative to their source/drain paths, where N is a positive integer. The MOSFETs are switched on and/or off by known charging/discharge circuits CLN, which are connected to a gate terminal and a source terminal of the MOSFETs. Such an arrangement can be configured as a high voltage switch." However, this design is still considered a high voltage switch connected to the contacts of the Pockels cell which acts as a parasitic capacitive load and undesirably slows down the uncontrolled full transitions from the ground or one voltage rail to another. Therefore, the inherent capacitance of the Pockels cell still acts disadvantageously with respect to the high voltage source switching, especially so for shorter high voltage transition times. The invention described in this patent utilizes the Pockels cell capacitance advantageously to facilitate controlled switching of the modulator control voltage to an arbitrary level between the supply voltage rail or rails and ground.

The patent EP2775619/U.S. Pat. No. 9,787,218B2 (HAMAMATSU) discloses a driving circuit which can selectively output one of a staircase wave and a square wave from an output terminal, to drive a capacitive load, and includes a first power source supplying a constant voltage VH, a first FET connected between the output terminal and the first power source, a first transformer in which an output side coil is connected to a gate of the first FET, a first input terminal connected to an input side coil of the first transformer via a capacitive element, a second power source supplying a constant voltage VL, a second FET connected between the output terminal and the second power source, a second transformer in which an output side coil is connected to a gate of the second FET, and a second input terminal connected to an input side coil of the second transformer via a capacitive element. This circuit is applicable to drive Pockels cells and provides a switching time of the Pockels cell in the range of a few nanoseconds. The shaping of the high voltage waveform is done by a staircase wave which is implemented using fixed current sources with fixed pulse duration. The current sources are based on the saturation characteristics of the FETs used in the switch. However, to use this solution for continuous non-repetitive control of the electro-optical device, the switching current has to be precisely stabilized. This is impossible in practice due to the current magnitude through a saturated FET being dependent on its operating temperature and manufacturing variation. This is made worse by the nature of capacitive load switching where the power dissipation in the switches is a linear function of the switching frequency and a quadratic function of the load voltage, further exacerbating the temperature dependent saturation current variation due to very high dissipated power at high voltages. Consequently, the modulation values required to reach some predetermined voltage become heavily dependent on the history of the modulation frequency and depth in a timeframe related to the thermal relaxation time of the FET cooling system which is usually on the order of tens of minutes to a few seconds.

The patent application WO2016026484 (A2)/US20170237221A1 (AMPHOS) presents an invention relating to a system for modulating laser pulses by means of an electro-optical modulator which is operated by means of a pulsed modulation voltage. A voltage converter mounted upstream of the modulator active components converts a pulsed modulated switching voltage at an output voltage level to the modulation voltage that is higher than the output voltage level as can be seen in figure [6] in the cited document. This invention is distinguished in the prior art by the use of the step-up transformer to produce high amplitude pulsed modulation voltage applied to the Pockels cell by converting from a relatively low control voltage. The magnetic circuit (transformer core) used in this invention must be reset after each pulse, which necessitates either a very long reset period, limiting the repetition rate, or a significant parasitic negative voltage pulse at the Pockels cell, which results in an unwanted modulation of the optical signal as the Pockels cell is sensitive to both voltage polarities. Any laser pulse arriving during the transformer reset period will be modulated by the parasitic negative voltage pulse. Furthermore, the maximum pulse width of the transformer is limited by its inductance and core saturation current, making the invention less suitable to modulating long bursts of pulses by employing long pulse durations. Longer pulse duration and larger Pockels inherent capacitance also exacerbate the problem of the parasitic negative pulse by increasing the time required for the magnetic reset of the transformer core material given a fixed negative parasitic pulse amplitude.

Laser devices and methods described in the prior art cited above use Pockels cells to control laser pulses. The Pockels cells are controlled by a high voltage (ranging up to 10 kV) driver or several drivers in various arrangements which commutate one or several high voltage sources to the terminals of the Pockels cell. The inherent capacitance of the Pockels cell (typically a few to a few tens of picofarads) acts against the desired operation of the modulator in all cases by either slowing down the transition times, making the modulation voltage dependent on previous parameters due to variable power dissipation in the switches or having parasitic modulation pulses where no laser pulse should be allowed to interact with the modulator. The invention described in this document uses the Pockels cell inherent capacitance advantageously as an integrating device for converting the controlled duration and/or amplitude current signal fed into the Pockels cell to a predetermined control voltage.

SUMMARY

The present invention has been created in consideration of the above-mentioned downsides of prior art solutions and offers a method and a device for controlling a Pockels cell. The control is performed by arbitrarily and precisely setting the Pockels cell voltage in the time intervals between the laser pulses thus enabling the Pockels cell to modify their phase, polarization and amplitude with more flexibility than described in prior art.

In the present invention, the Pockels cell voltage driver operation is based on a constant value of the Pockels cell capacitance $C_{PC}$ which is typically a few to few tens of picofarads. The Pockels cell, being a near-ideal capacitor, is able to store an electrical charge $Q_{PC}$. When the Pockels cell is charged, a potential difference or voltage is developed across its terminals. This voltage $V_{PC}$ is a linear function of charge $Q_{PC}$ flowing into and out of the cell and increases with increasing charge proportionally to $C_{PC}$. Therefore, the actual voltage $V_{PC}$ between the plates of the capacitor can be calculated as:

$$V_{PC} = \frac{Q_{PC}}{C_{PC}}.$$

$Q_{PC}$ itself is an integral function of the charging current magnitude $I_{PC}$ and duration $t_0$:

$$Q_{PC} = \int_0^{t_0} I_{PC} dt.$$

As a result, the total Pockels cell voltage can be expressed as an integral function of the charging current magnitude $I_{PC}$ and duration $t_0$ when the Pockels capacitance is constant:

$$V_{PC} = \frac{1}{C_{PC}} \int_0^{t_0} I_{PC} dt.$$

From this we can conclude that the instantaneous Pockels cell voltage can be continuously modulated by varying the current flowing into or out of the device:

$$V_{PC}^{t2} = V_{PC}^{t1} + \frac{1}{C_{PC}} \int_{t_1}^{t_2} I_{PC} dt$$

where $V_{PC}^{t1}$ and $V_{PC}^{t2}$ are the instantaneous Pockels cell modulation voltages at time instances $t_1$ and $t_2$, respectively. The current magnitude $I_{PC}$ must be able to acquire negative as well as positive values for the modulation to work.

From the above equations, we can derive the minimum current magnitude needed to modulate the Pockels cell at a rate which is sufficient for maximum theoretical pulse-to-pulse modulation depth at some predefined laser repetition rate defined by a period $t_1$ and a given Pockels cell half-wave voltage $V_{\lambda/2}$. Let $t_1=10$ ns and $V_{\lambda/2}=1000V$, then from time $t_1$ to time $t_2$ the voltage must reach full 1000 V excursion for 100% modulation depth and $V_{PC}^{t2}-V_{PC}^{t1}=1000$ V. Given $C_{PC}=8$ pF and modulation from $V_{PC}^{t1}=0$ or full blocking of the beam to full transmission at $V_{PC}^{t2}=1000$ V, we must satisfy:

$$1000 \text{ V} < \frac{1}{8 \times 10^{-12}} \int_0^{10^{-8}} I_{PC} dt \rightarrow I_{PC} > 0.8 \text{ A}.$$

10 ns long pulses of 0.8 A current are well within the possibilities of modern semiconductor devices. Nevertheless, $C_{PC}$ is usually not the only capacitance acting on the switch output. Total capacitance includes the mounting parasitic capacitance $C_{PAR}$ and an inherent switch capacitance $C_{SW}$ which are on the order of a few picofarads for a well-designed driver. If these parasitic contributions to total capacitance do not change with modulation depth or time, the modulator transfer function remains linear, making the device suitable for practical applications.

In order to accomplish the objective, the Pockels cell driver comprises a plurality of switching cells (FIG. 1) with current feedback (FIG. 2). The switching cells further comprise a switching element (FIG. 3). The aforementioned switching element can be arranged in multiple configurations (FIG. 4), having trade-offs between maximum operating voltage, control flexibility and cost. The Pockels cell can then be connected to one or more nodes in the circuit, which have desirable current control properties. In all cases, the Pockels cell capacitance $C_{PC}$ acts as the load (FIG. 4a). The control inputs of the switching cells are then excited with a signal S composed of pulses of specific voltage and duration $t_c$, corresponding to voltage $C_{PC}^{t_c}$ being developed on the Pockels cell:

$$V_{PC}^{t_c} = \frac{1}{C_{PC}} \int_0^{t_c} I_{PC}(S(t)) dt$$

It is advantageous, but not necessary, for $I_{PC}(S)$ to be linear.

In contrast to the Pockels cell driving methods known from the prior art, in this embodiment the Pockels cell driving voltage $V_{PC}$ is related to the electrical charge $Q_{PC}$ accumulated within the inherent Pockels cell capacitance $C_{PC}$, not the supply rail voltage. Because $Q_{PC}$ is a function of to the current pulses $\int_0^{t_c} I_{PC}(S(t)) dt$ applied to $C_{PC}$, this allows for pulse-to-pulse changes in the Pockels cell signal amplitude without changing the circuit supply voltage and results in a more efficient drive scheme at low modulation depths (low $V_{PC}$), as the charge dissipated in the driving transistors is related to $V_{PC}$ as opposed the high voltage supply. This contrasts with the prior art, where the methods and devices are based mainly on full high voltage rail application at the driver output to the Pockels cell, and the Pockels cell inherent capacitance $C_{PC}$ is considered to be a parasitic component, causing undesirable delays at the output, long transient states and high-power dissipation. Here, the Pockels cell control voltage is set and changed at the instants between laser pulses by applying low voltage signals at the switching cell control input that are converted into corresponding current pulses into or out of the Pockels cell with variable width, amplitude or both. Any laser pulses in between the transitions interact only a constant voltage level. This allows for modulation for pulse bursts as well as single pulses.

DRAWINGS

In order to better understand the invention, and appreciate its practical applications, the following pictures are provided and referenced hereafter. Figures are given as examples only and in no way shall limit the scope of the invention.

FIGS. 1a-c illustrate the schematic embodiments of a single switching cell;

FIGS. 2a-d illustrate the schematic embodiments of current feedback circuits used in the switching cells;

FIG. 3 illustrates multiple switching cells stacked to form a high voltage switching element;

FIGS. 4a-c illustrate possible configurations of multiple switching elements comprising the Pockels cell driver in: a) unipolar or bipolar drive configuration, b) bipolar drive configuration and c) unipolar drive configuration with reduced voltage requirement for the switching element;

FIGS. 5a-d illustrate optical circuits with the driven Pockels cell for controlling the phase, polarization, and amplitude of a pulsed light source;

DRAWINGS—REFERENCE NUMERALS

Figure 1A:
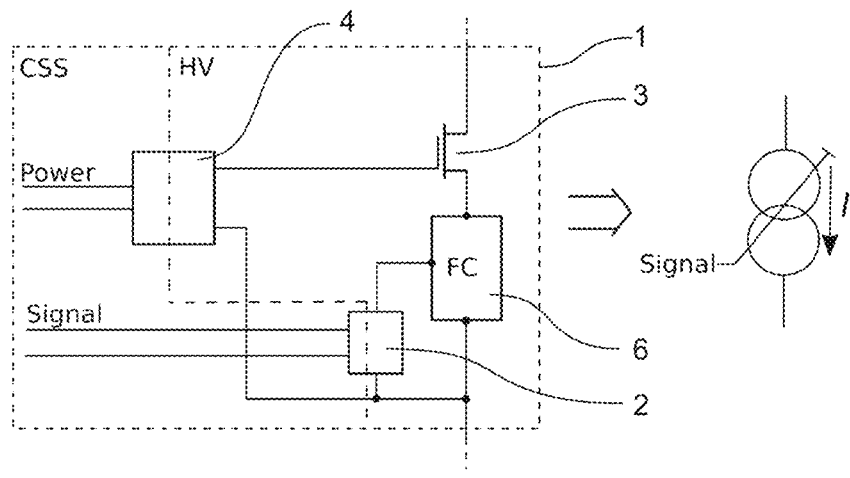

1 Single switching cell, where CSS is Control Signal Side, HV is High Voltage side and FC is Feedback Circuit
2 Input signal isolator (transformer or optical circuit)
3 Switching MOSFET element of the switching cell
4 Isolating power supply unit (PSU)
5 Isolating power supply unit (PSU) and signal isolator (transformer or laser diode coupled to a photodiode)
6 Arbitrary feedback circuit FC with three ports
7 Arbitrary feedback circuit FC with two ports
8 Arbitrary feedback circuit FC with four ports
9 Feedback resistor
10 NPN transistor
11 PNP transistor
12 Input resistor
13 Diode
14 Depletion mode transistor 15 Feedback resistor
16 A single switching element of Pockels cell driver
16-1, 16-2, 16-3, 16-4 designations of multiple switching elements in different topologies of Pockels cell driver
17 Pockels cell driver
17-1, 17-2, 17-3 designations of different topologies of Pockels cell driver (topology options: unipolar or bipolar or fully bipolar)
18 Pockels cell
19 Polarising element
20 Waveplate
21 Polarising element
22 Mirror

DETAILED DESCRIPTION

The invention comprises a Pockels cell driver system and a method of driving a Pockels cell by means of said driver system.

Pockels Cell Driver.

The Pockels cell driver (17) is capable of arbitrarily setting the Pockels cell voltage in the time interval between two consecutive laser pulses. The main building block of the driver is the switching cell (1) (FIG. 1a), which comprises, at least, a high voltage transistor (3), an arbitrary feedback circuit of (6), (7), (8) sensitive to the current flowing through said transistor, a power supply (4) and a control element (2). The voltage withstanding capability of the switching cell is generally the same as the breakdown voltage of the transistor (3).

Figure 1B:
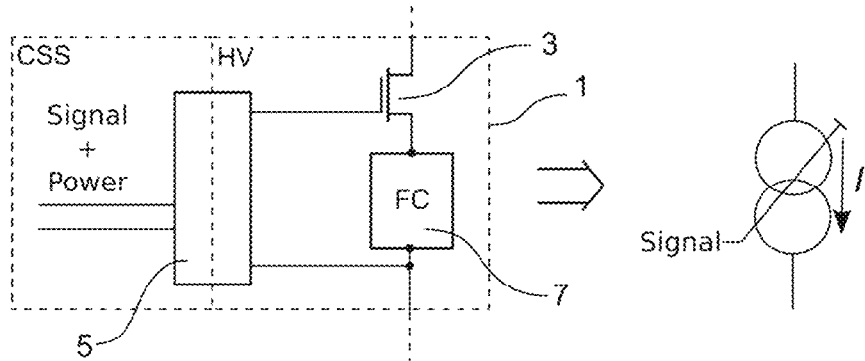
Figure 1C:
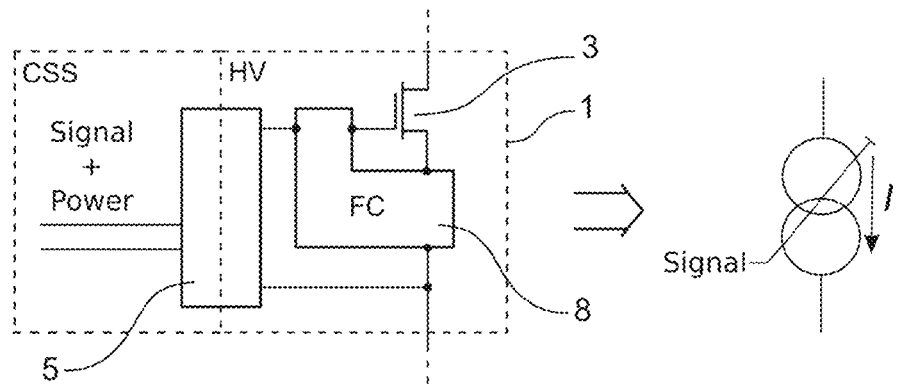

Due to the high voltage nature of the driver, the power supply (4) and control elements (2) must be galvanically isolated from the external control circuitry. Such isolation circuits are well known to those well versed in the art and rely mainly on magnetic or optical signals, excited at the low voltage side, which are subsequently converted back to electronic signals at the high voltage side. Due to the low power requirements for the power supply of the switching cells described herein, no hard distinction between the power and control signals is necessary, as the power needed is well on the order of the power carried by information signals as they are widely understood in the art. As a result, the signals can be combined into one and transferred through a single isolator (5) as per FIG. 1b and FIG. 1c. Nevertheless, in some applications, it would be advantageous to separate the power and control signals for easier control of the switching cell on the low voltage side. This is especially true for high repetition rate applications where higher average power of the control signal can impede its accurate generation due to more powerful components having higher parasitic capacitances. Moreover, due to the low power requirements, optical as well as magnetic signal transmission can be utilized, although the latter is usually more powerful due to well-understood engineering constraints. The exact power and information transfer setup of the switching cell, therefore, does not modify the final current pulse produced by the switching cell significantly.

Various feedback schemes for the stabilization of current I are well known in the art. At least three different feedback circuit FC types (6), (7) and (8) are suitable for controlling the current I magnitude passing through the switching cell (1). The feedback circuits (6), (7) and (8) can consist of a single passive element such as the feedback resistor (15) depicted in FIG. 2a, or a more elaborate circuit such as the one depicted in FIG. 2b, featuring an additional depletion mode FET device (14). Alternatively, a circuit such as the one depicted in FIG. 2d, measuring the current I flowing through the cell (1) and modulating it through the high voltage transistor's (3) gate terminal can be implemented. A third control terminal can also be used as depicted in FIG. 2c in cases where the power and control signals are separate.

Figure 2A:
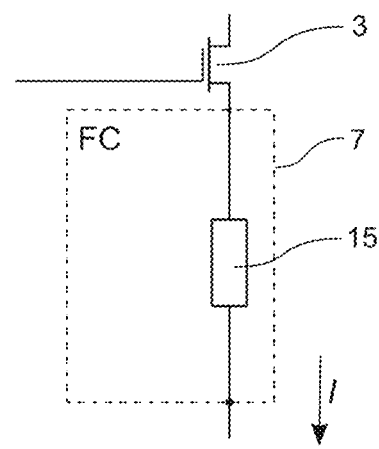
Figure 2B:
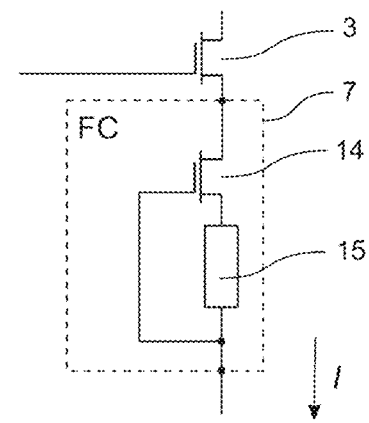

An example embodiment of the two-port feedback circuit (7) used for current I feedback in the switching cell (1) where the power and control signals are combined is depicted in FIGS. 2a and b. The circuit of FIG. 2a consists of a single resistor which reduces the gate terminal voltage of the high voltage MOSFET (3) with respect to its source terminal when the current flowing through the resistor increases. Alternatively the circuit can be expanded to include a depletion mode FET. It consists of a depletion mode device (14) and a resistor (15). In that case, the feedback circuit (7), depicted in FIG. 2b, resists the current I flowing through it when the voltage induced by this current across the feedback resistor approaches the threshold voltage of the depletion mode device (14). The current I flowing through the switching cell (1) is then reduced or stopped by turning off the upper MOSFET (3) as the feedback circuit (7) brings its gate-source voltage to zero. The depletion mode device in this circuit serves to decouple the effects of thermally induced drift in the MOSFET (3) from the feedback operation and increase the gain of the whole circuit. The two-port circuit with a depletion mode device depicted in FIG. 2b is insensitive to the amplitude variation of the driving signal and can only be controlled by changing its active duration.

Figure 2C:
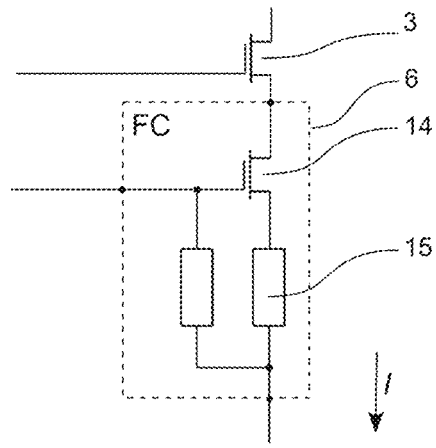

An example embodiment of the three-port feedback circuit (6) is depicted in FIG. 2c. It consists of an enhancement mode device connected at the source terminal of the high voltage MOSFET (3). In contrast to the two port circuit shown in FIG. 2b, here the amplitude of the control signal can be used to modulate the current I magnitude.

Figure 2D:
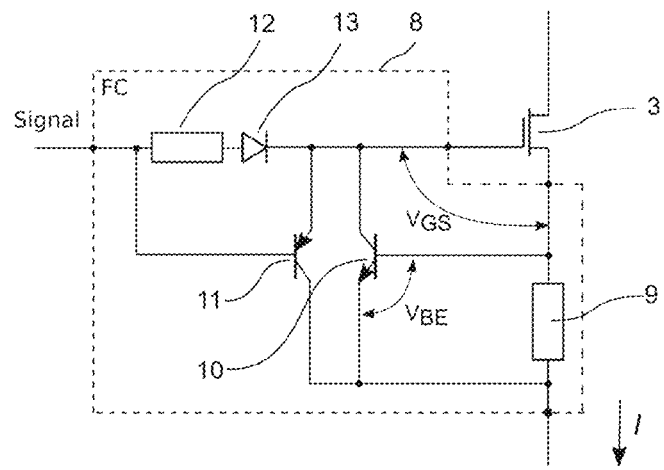

An example embodiment of the four-port feedback circuit (8) is presented in FIG. 2d. It provides source and gate connections to the current I carrying MOSFET transistor (3) of the switching cell (1), a resistor (9) for measuring said current and a feedback NPN transistor (10) for shunting the transistor's (3) gate-source voltage $V_{GS}$ to ground when the voltage on the feedback resistor (9) exceeds the base-emitter voltage $V_{BE}$ of the NPN transistor (10). In this way, the feedback circuit (8) resists the current flow I through the source of the MOSFET (3), thus turning off the MOSFET (3) by bringing its gate-source voltage below the turn-on threshold. PNP transistor (11), resistor (12) and diode (13) are used for shunting the $V_{GS}$ of the high voltage MOSFET (3) to source when the input signal voltage is turned off.

In the case of the feedback circuits (6), (7) and (8), it is preferable to have them thermally isolated from the main MOSFET (3) of the switching cell in order to have minimal thermally induced drift of switching parameters of the whole driver assembly. Since the feedback circuits (6), (7) and (8) generate several orders of magnitude less heat than the main switching MOSFET (3) and the precise current I values flowing through the switching cell (1) do not depend on the characteristics of the main MOSFET (3) given sufficiently high gain of the feedback circuit, a driver with a thermally isolated feedback circuit is less prone to self-heating induced non-linearity and can operate accurately over a wide switching frequency and current I magnitude range.

In all cases, it is advantageous to have the feedback circuit act through the source of the switching transistor (3) so as to avoid acting on the parasitic drain-gate capacitance of the transistor (3). This allows for fast switching of the cell (1) and improves the linearity of the device by increasing the overall gain available for current control. This arrangement is known in the art as "cascode" arrangement.

Figure 3:
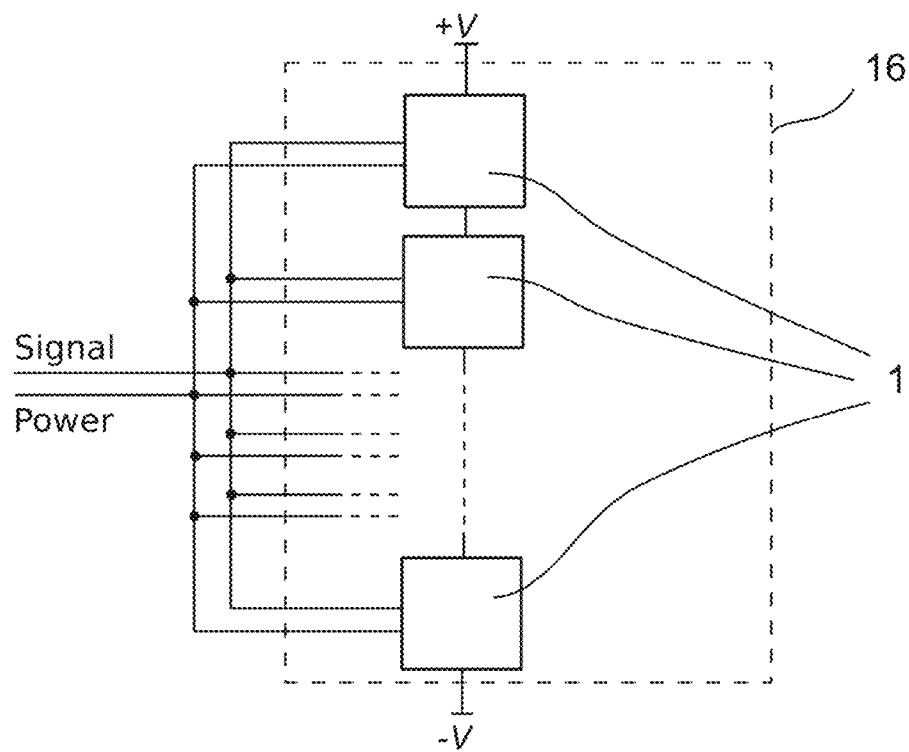

Multiple switching cells (1) can be stacked together to form a switching element (16) (FIG. 3). This is advantageous due to the higher voltage capability of such a stack. Ignoring stacked circuit parasitic capacitances, the voltage capability of a switching element can be as high as the sum of the voltage ratings of the individual switching cells (1) within the stack (16). In practice, the switching cells (1) cannot be stacked in arbitrarily large numbers due to said parasitic elements, thus limiting the voltage capability of a single switching element (16). This makes it advantageous to have different arrangements (17-1 to 17-3) of switching elements (FIG. 4a-c) with different trade-offs between the number and polarity of supply voltages, maximum voltage that can be developed on the Pockels cell (18) and flexibility of controlling said voltage $V_{PC}$.

Figure 4A:
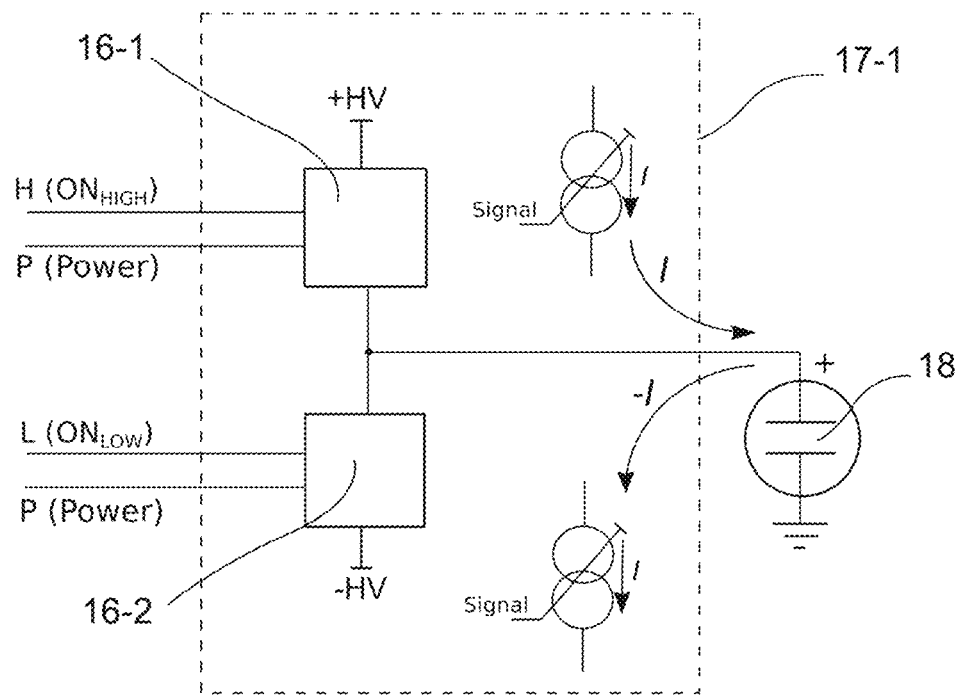

The simplest possible arrangement (17-1) of the switching elements (16-1) and (16-2) as depicted in FIG. 4a has current being injected or extracted from the Pockels cell (18) inherent capacitance $C_{PC}$ with one switching element (16-1) being used for injection and another one (16-2) for extraction. The maximum and minimum voltage which can be developed on the Pockels cell (18) terminals is limited by the power supplies +HV and −HV. If the −HV supply is connected to ground together with the negative Pockels cell (18) electrode, then such arrangement can be called unipolar. That is, an arrangement of switching elements where the Pockels cell (18) can only have voltage excursions in one direction of the electric field between its electrodes. If a negative power supply is used, the arrangement becomes bipolar, since the positive electrode of the Pockels cell (18) can be brought below the ground potential of the opposing electrode. Bipolar arrangement of switching elements (16-1) and (16-2) has the highest voltage requirement for the individual elements with a given voltage excursion of the Pockels cell (18), as the switching elements (16-1) and (16-2) must withstand the full peak-to-peak voltage developed on the Pockels cell (18).

Figure 4B:
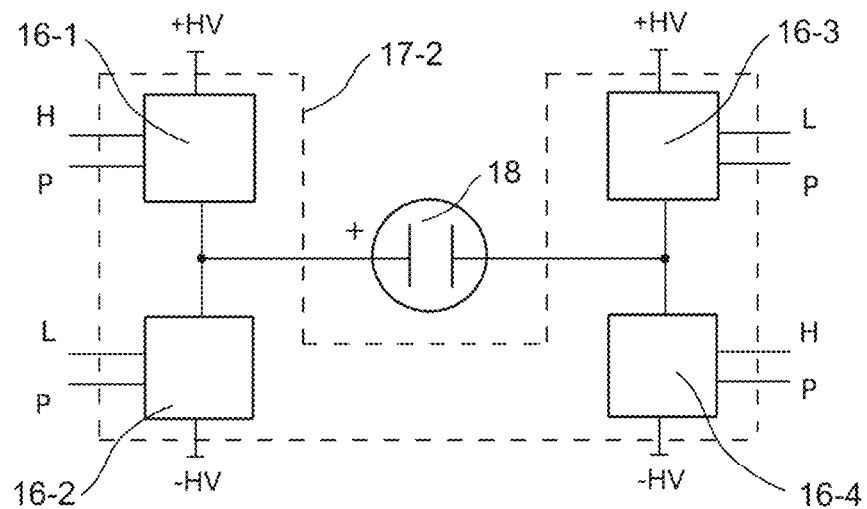

Another possible arrangement of the switching elements (16-1), (16-2), (16-3) and (16-4) is an exclusively bipolar arrangement (17-2) depicted in FIG. 4b. Both of the Pockels cell (18) electrodes are being driven in this arrangement, thus allowing both positive and negative excursions of the Pockels cell (18) voltage with a single unipolar +HV supply while the −HV electrode is connected to power supply ground. The −HV electrode can also be connected to a supply negative with respect to ground, thus increasing the total voltage. In either case, the switching elements (16-1), (16-2), (16-3) and (16-4) in this configuration (17-2) must withstand only half of the total peak-to-peak voltage excursion of the Pockels cell (18). Advantageously, the required power supply voltage is also half of the peak-to-peak voltage developed across the Pockels cell during a full switching cycle. The Pockels cell (18) is charged by turning on the elements (16-1) and (16-4) with equal magnitude currents and charged in the opposite direction by turning on the elements (16-2) and (16-3). This results in both a positive and a negative voltage excursion in the Pockels cell (18) during one full-amplitude switching cycle. Such bipolar drive is advantageous in some applications where the Pockels cell (18) is made of crystals with significant unwanted polarization under DC electric fields. Bipolar excitation removes the DC component from the drive waveform.

Figure 4C:
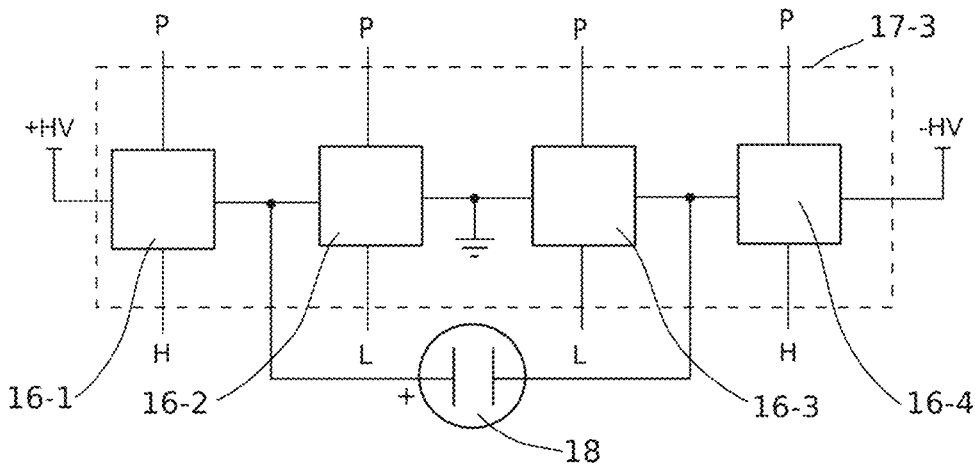

Yet another possible arrangement of the switching elements (16-1), (16-2), (16-3) and (16-4) is an exclusively unipolar arrangement (17-3) depicted in FIG. 4c. Switching elements (16-1) and (16-2) are arranged in series and connected between the positive power supply node and ground. Switching elements (16-3) and (16-4) are analogously connected to the negative supply. The positive terminal of the Pockels cell (18) is connected at the interconnection point between elements (16-1) and (16-2) while the negative terminal is connected at the interconnection point between elements (16-3) and (16-4). As a result, the elements (16-1) and (16-4), when switched on simultaneously and with equal current magnitude, charge the Pockels cell (18), while the elements (16-2) and (16-3) discharge it to ground. This results in an arrangement where the individual elements (16-1), (16-2), (16-3) and (16-4) are only exposed to half of the full peak-to-peak voltage excursion developed between the terminals of the Pockels cell (18) with the Pockels cell (18) only developing an electric field in one direction. Furthermore, the voltage requirement for an individual power supply is reduced to half of the peak-to-peak voltage excursion of the Pockels cell (18).

Any one of the above-mentioned switching element arrangements can be considered a Pockels cell driver (17). The driver (17) can be connected to different optical circuits with example embodiments being shown in FIG. 5 a-d. Depending on the components used in conjunction with the Pockels cell (18), the circuits can be categorized into those for control of light's phase (FIG. 5a), polarization (FIG. 5b) or intensity (FIG. 5c-d). The latter can be further divided into single-pass (FIG. 5 a-c) and double-pass (FIG. 5d) configurations where light passes the Pockels cell (18) once in one direction or is reflected back and passes the Pockels cell (18) twice, going in one direction and then in the opposite direction. This arrangement (FIG. 5d) is advantageous due to increased optical pulse and crystal interaction length, lowering the voltage requirement by half for the same modulation depth. In combination with the voltage-halved double-pass arrangement depicted in FIG. 5d and (17-2) or (17-3) arrangement of the switching elements (16) depicted in FIGS. 4b and 4c, any single supply voltage can be a quarter of the intrinsic Pockels cell (18) λ/2 voltage requirement for a given modulation depth. Since dissipated power, which is a limiting factor in the Pockels cell driver design, depends quadratically on the voltage and linearly on the repetition rate of the switching events, it is understood, that for every halving of the driving voltage, the repetition rate can be increased four times.

Figure 5A:
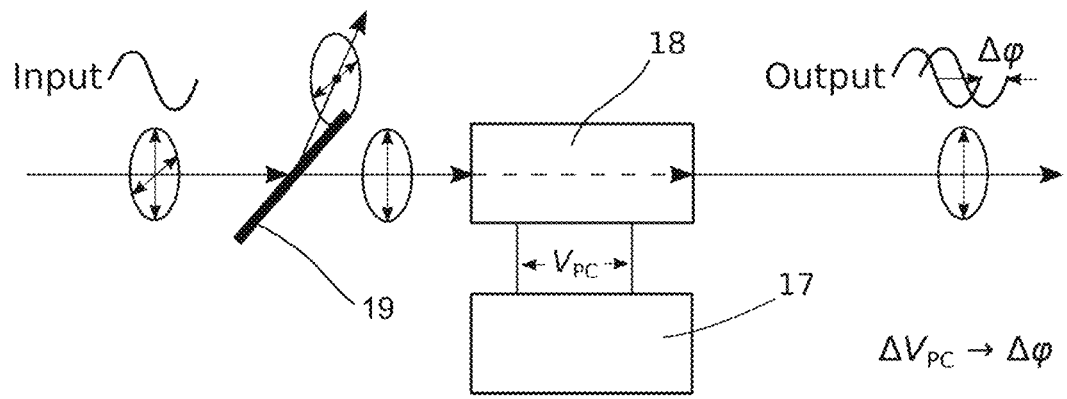

Phase modulation is performed with the setup in FIG. 5a. The setup comprises a polarizing element (19) and a controlled Pockels cell (18) with a driver (17). The first polarizing element (19) defines the input polarization. Further, the Pockels cell (18) is oriented with respect to the input polarization such, that it operates as an arbitrarily controlled waveplate with a variable phase shift Δφ, dependent on the control voltage $V_{PC}$ applied to the contacts of the Pockels cell (18).

Figure 5B:
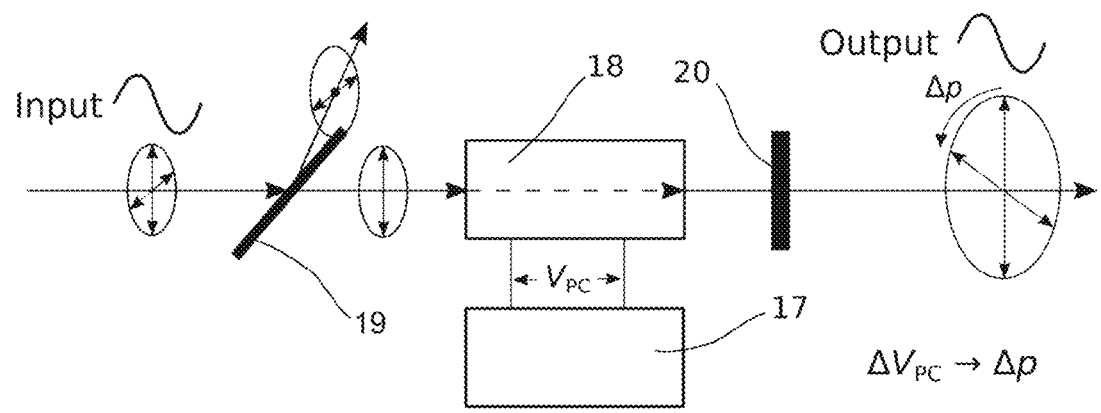
Figure 5C:
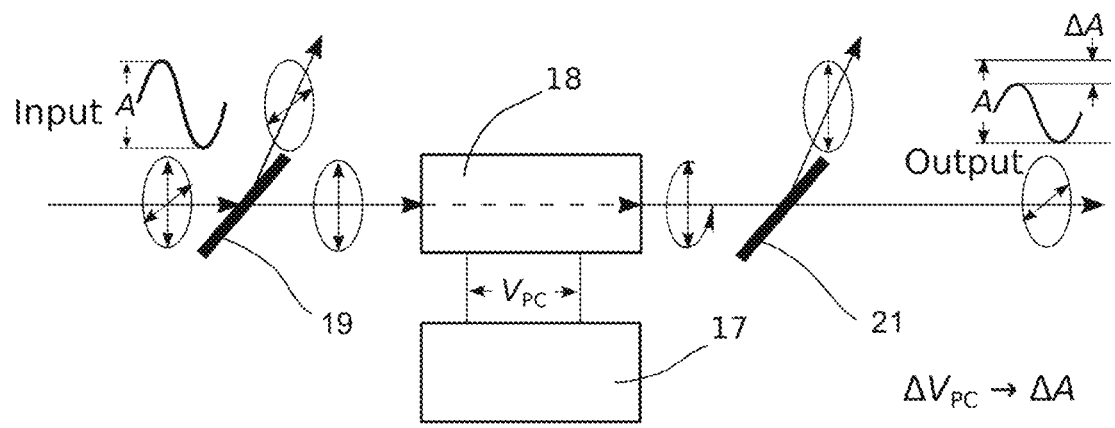
Figure 5D:
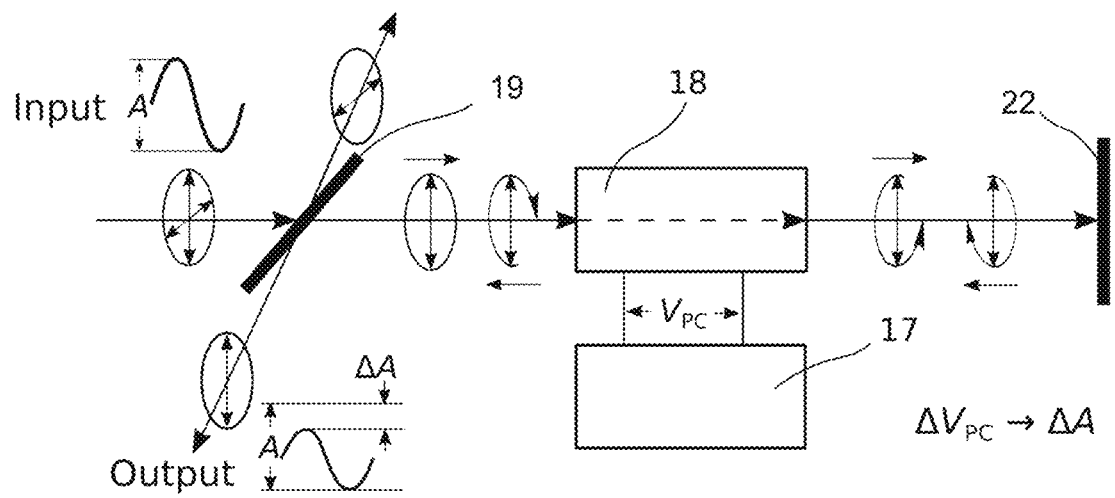

Polarization modulation is performed with the setup in FIG. 5b. The setup comprises a polarizing element (19), a controlled Pockels cell (18) oriented such that the incident light is split into two equal magnitude orthogonal polarization components, a driver (17), and a Waveplate (20) at the output. The first Polarising element (19) allows laser pulses with a vertical polarization to pass through. Further, the polarization change Δp is done in combination with an arbitrary shift between the two orthogonal polarization components inside the crystals of the controlled Pockels cell (18) and a fixed phase shift using a waveplate (20).

Intensity modulation is performed with the setup in FIG. 5c. The setup comprises two polarizing elements (19) and (21), and a controlled Pockels cell (18) with a driver (17). The first Polarizing element (19) defines the input polarization. Further, the Pockels cell (18) is oriented such that together with its driver (17) it changes polarization to circular wherein the phase shift between the two polarization components of light may be chosen arbitrarily between 0 and λ/2 by varying the Pockels cell control voltage $V_{PC}$. Further, the second polarizing element (21) removes the component with polarization orientation matching the incident polarization of the laser pulse, and transmits the orthogonally polarized component of the laser pulses with an arbitrary amplitude change ΔA defined by the phase retardation in the Pockels cell (18), as modulated by the driver electronics (17).

Double pass configuration in FIG. 5d operates similarly, except the light beam is reflected back from the mirror (22) through the Pockels cell (18) after it has passed through it. The same polarizer (19) is used for defining the incident polarization and rejecting unwanted output polarization.

Figure 6:
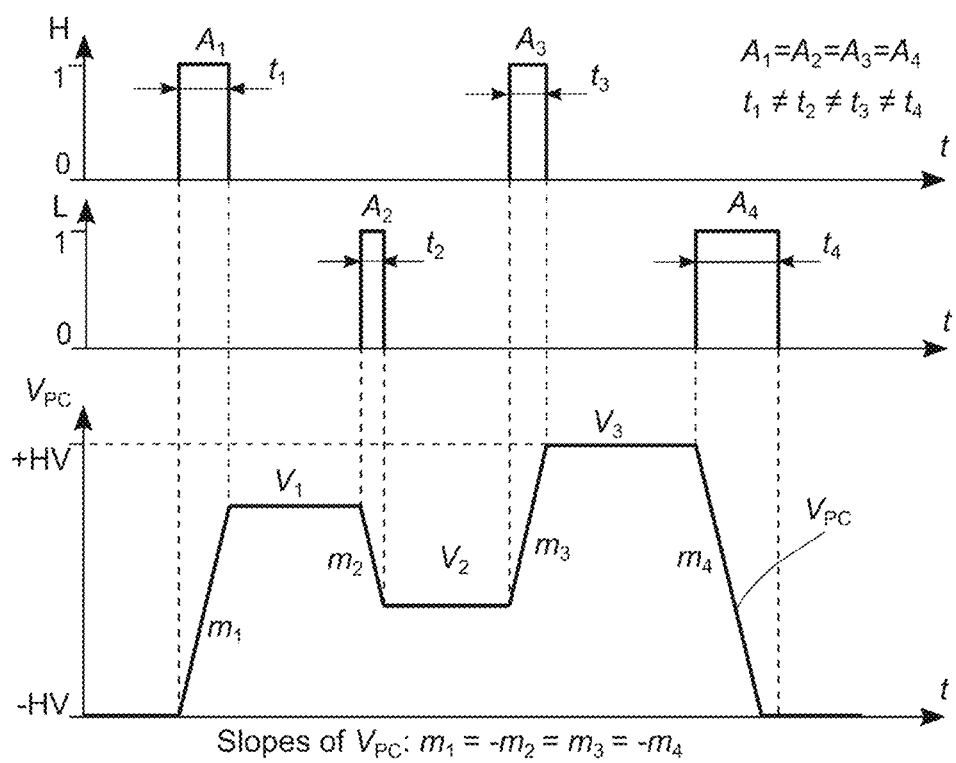
FIG. 6 illustrates Pockels cell voltage control by modulating the control pulse width which changes the current integration time on its inherent capacitance.
Figure 7:
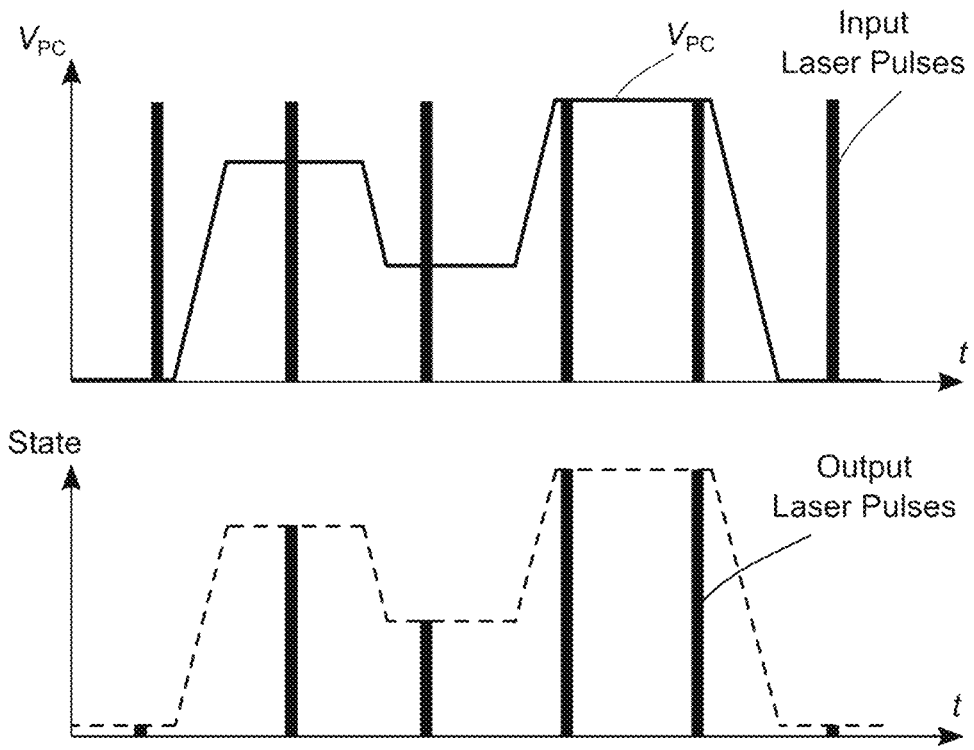
FIG. 7 illustrates the amplitude modulation of light pulses with regard to Pockels cell control voltage.
Figure 8:
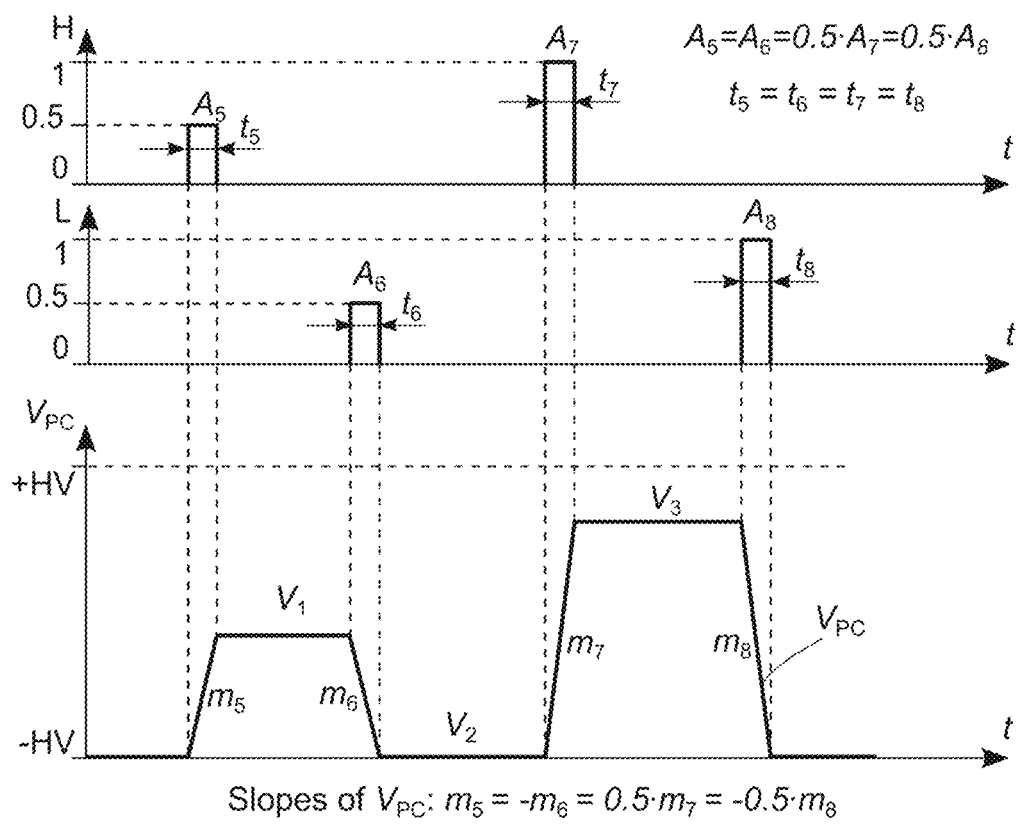
FIG. 8 illustrates Pockels cell voltage control by modulating the control pulse amplitude, which changes the magnitude of the current being integrated.

Control of the driver (17) can be achieved by modulating the control signal pulse width (FIG. 6), which changes the current integration time in the Pockels cell (18). In this case, the absolute values for $V_{PC}$ rising slopes $m_1$, $m_3$ and falling slopes $m_2$, $m_4$ are equal: $m_1=m_3=-m_2=-m_4$. Alternatively, pulse amplitude can be modulated, which changes the current magnitude (FIG. 8), with $V_{PC}$ slopes $m_5$, $m_6$, $m_7$, $m_8$ being proportional to the control pulse amplitudes $A_5$, $A_6$, $A_7$, $A_8$. Both of these methods can also be combined. The control signals and corresponding changes in the Pockels cell control voltage $V_{PC}$ are depicted in FIG. 6. The correspondingly modulated laser pulses are shown in FIG. 7.

Pockels Cell Driving.

The method or process of controlling the Pockels cell voltage $V_{PC}$ is governed by the relation:

$$V_{PC}^{t2} = V_{PC}^{t1} + \frac{1}{C_{PC}} \int_{t_1}^{t_2} I_{PC}(S(t))dt.$$

Here $V_{PC}^{t1}$ is the initial voltage at modulation start time $t_1$, $C_{PC}$ is the Pockels cell inherent capacitance, $I_{PC}$ is the current flowing through the Pockels cell, excited by an input signal S until the stop time $t_2$ when the Pockels cell control voltage reaches a stable value of $V_{PC}^{t2}$. A change in Pockels cell control voltage can then be defined as $\Delta V_{PC}=V_{PC}^{t2}-V_{PC}^{t1}$.

The current being integrated by $C_{PC}$ is set by the control signal supplied at the input of each individual switching cell:

$$I_{PC}=F(S(t))$$

where F(S) is a transfer function between said arbitrary control signal SW and current flowing into the Pockels cell capacitance $I_{PC}$. F(S) is defined by the practicalities of the feedback circuit and the isolation barrier. Any transfer function is in principle fit for the purpose of this invention as long as it can be known in advance of applying the control signal. Preferably, F(S) is independent or weakly dependent on external parameters such as temperature, humidity and manufacturing variation. More preferably, F(S) is a linear function.

S(t) must be able to attain both positive and negative values to be able to charge as well as discharge the Pockels cell. Due to practicalities of implementing dedicated current source and sink circuits versus a circuit capable of both modes of operation, the signal is split into two signals H(t) and L(t) for controlling the sourcing of current into the Pockels cell and sinking the current out of the cell, respectively:

$$I_{PC}=F(H(t)-L(t)).$$

The control signal H(t) is supplied to the switching element corresponding to (16-1) while L(t) is supplied to (16-2) as shown in FIG. 4a.

For illustration purposes we can assume that H(t)=L(t)=const for each drive interval $t \in [t_1; t_2]$ and zero otherwise. Thus, the changes in the Pockels cell voltage $\Delta V_{PC}$ depend only on the control signal polarity chosen by driving either H(t) or L(t) and the duration $\Delta t=t_2-t_1$ during which the control signal is applied to the circuit. A table for the control signals and corresponding changes to the Pockels cell voltage $\Delta V_{PC}$ for the 3 driver topologies shown in FIGS. 4a to 4c are presented below:

| Driver topology | Control signals corresponding to Pockels cell control voltage |
|---|---|
| Unipolar (17-1) FIG. 4a | 1. Any combination of $H \cdot \Delta t \leq 0$ and $L \cdot \Delta t \leq 0$ → $\Delta V_{PC} = 0$; <br> 2. $H \cdot \Delta t > 0 \rightarrow \Delta V_{PC} > 0$, $H \cdot \Delta t \leq 0 \rightarrow \Delta V_{PC} = 0$; <br> 3. $L \cdot \Delta t > 0 \wedge -\Delta V_{PC} > 0$, $L \cdot \Delta t \leq 0 \rightarrow \Delta V_{PC} = 0$; <br> 4. $H \cdot \Delta t > 0 \wedge L \cdot \Delta t > 0$ is not desirable as it is associated with destructively high-power losses; |
| Bipolar (17-2) FIG. 4b and unipolar with bipolar power supply (17-3) FIG. 4c | 1. Any combination of $H_{16-1} \cdot \Delta t \leq 0$, $L_{16-2} \cdot \Delta t \leq 0$, $L_{16-3} \cdot \Delta t \leq 0$, $\Delta H_{16-4} \cdot \Delta t \leq 0 \rightarrow \Delta V_{PC} = 0$; <br> 2. Any single signal $H_{16-1} \cdot \Delta t > 0$, $H_{16-4} \cdot \Delta t > 0$, $L_{16-2} \cdot \Delta t > 0$ or $L_{16-3} \cdot \Delta t > 0 \rightarrow \Delta V_{PC} = 0$; <br> 3. $L_{16-3} \cdot \Delta t > 0 \wedge H_{16-1} \cdot \Delta t > 0 \rightarrow -\Delta V_{PC} > 0$; <br> 4. $L_{16-2} \cdot \Delta t > 0 \wedge H_{16-4} \cdot \Delta t > 0 \rightarrow -\Delta V_{PC} > 0$; <br> 5. $H_{16-1} \cdot \Delta t > 0 \wedge H_{16-4} \cdot \Delta t > 0 \rightarrow 2 \cdot \Delta V_{PC} > 0$; <br> 6. $L_{16-2} \cdot \Delta t > 0 \wedge L_{16-3} \cdot \Delta t > 0 \rightarrow -2 \cdot \Delta V_{PC} > 0$; <br> 7. Application of $H_{16-1} \cdot \Delta t > 0 \wedge L_{16-2} \cdot \Delta t > 0$ or $H_{16-3} \cdot \Delta t > 0 \wedge L_{16-4} \cdot \Delta t > 0$ is not desirable as it is associated with destructively high-power losses; |

The Pockels cell control process starts from a control signal of a preset duration and amplitude being generated by an external control source. The signal then propagates through the signal isolator (2) or (5) where it is converted to an intermediate optical or magnetic signal and reaches the input of the Feedback Circuit (6), (7) or (8) and high voltage MOSFET (3) system with its amplitude and duration being substantially related to the original control signal generated by the external control source at the input to the isolator. Preferably, an isolating power supply unit (4) may be set to generate a bias voltage for the plurality of switching cell transistors (3) in the switching elements (16) and the control signals H and L may be separated from the power supply signal P. A first switching element (16-1 in FIG. 4a) or a first plurality of switching elements (16-1 and 16-4 in FIGS. 4b and 4c) are turned on by the signal H for a first time interval $t_1$ (FIG. 6). As a result, current flows through the switching elements (16-1, 16-4) and the Pockels cell (18), with the duration and magnitude of the current being substantially related to the input control signal H duration t and magnitude, respectively. The charge carried by the current flowing into the Pockels cell (18) is integrated by its inherent capacitance $C_{PC}$ to obtain some first voltage $V_{PC}=V_1$ (FIG. 6). The first voltage $V_1$ induces a change in birefringence of the Pockels cell crystals which is then sampled by the laser pulses. Depending on the optical configuration this may result in phase (FIG. 5a), polarization (FIG. 5b) or amplitude (FIGS. 5c to 5d) modulation of the coincident laser pulse interacting with the crystals in the Pockels cell (18).

A second voltage level $V_{PC}=V_2$ (FIG. 6) is obtained by turning on a second switch (16-2 in FIG. 4a) or a plurality of switches (16-2 and 16-3 in FIGS. 4b and 3c) for the second time interval $t_2$ (FIG. 6) in such a way as to induce a second current in the opposite direction of the first current in order to decrease the voltage $V_{PC}$ of the Pockels cell (18) by draining charge from its inherent capacitance $C_{PC}$.

Alternatively, the Pockels cell (18) voltage $V_{PC}$ can be further increased to some other arbitrary value $V_{PC}=V_3$ from any other arbitrary value $V_{PC}=V_2$ by inducing (FIG. 6) a current for third time interval $t_3$ which is in the same direction as the first current by turning on the first switch (16-1 in FIG. 4a) or the first plurality of switches (16-1 and 16-4 in FIGS. 4b and 4c).

The number of voltage modification steps and switch turn-on signal parameters can be chosen arbitrarily in order to obtain any desired modulation depth for any number of desired modulation steps.

Preferably, the current magnitude can be set to such a value that the full required excursion of voltage is possible during the time interval between two consecutive laser pulses (e.g., intervals between $1^{st}$ to $2^{nd}$ pulses, between $2^{nd}$ to $3^{rd}$ pulses, between $3^{th}$ and $4^{th}$ pulses and between $5^{th}$ and $6^{th}$ pulses, in FIG. 7). This allows for arbitrary pulse-to-pulse modulation of pulse parameters in pulsed laser systems.

More preferably, the current magnitude may be chosen such that a plurality of laser pulses may interact with the Pockels cell during the voltage transition and the duration of the control pulse may correspondingly be increased to some multiple of the laser pulse period, imparting a monotonously and linearly variable envelope to a plurality of laser pulses.

Yet more preferably, the duration of the differential control signals H(t) and L(t) may be chosen to be arbitrarily long, and their amplitude may be arbitrarily varied during a single modulation step so as to impart any monotonous variation to the envelope of a plurality of laser pulses interacting with the Pockels cell (18). The monotonicity requirement can be relaxed by making H(t) and L(t) vary synchronously so as to have L(t)>0 when H(t)≤0 and vice-versa. The above-mentioned process is described by the formula:

$$V_{PC}(t) = V_{PC}^{t_1} + \frac{1}{C_{PC}} \cdot \int I_{PC}(t)dt.$$

Here $V_{PC}^{t_1}$ is the initial voltage of the Pockels cell, $I_{PC}(t)=F(H(t)-L(t))$ is the Pockels cell current, defined by the signal transfer function F, and $V_{PC}(t)$ is the time-varying Pockels cell control voltage. The changing voltage $V_{PC}(t)$ imparts a corresponding variation to the envelope of a plurality of laser pulses interacting with the Pockels cell.

The method of driving the Pockels cell comprises at least the steps of:
1. A priori knowledge of the voltage $V_{PC}^{t_1}$ in the time interval $t \in [t_1; t_2]$;
2. Deriving or calculating the control signal functions H(t) and L(t) for the said time interval $t \in [t_1; t_2]$ with a priori knowledge of the transfer function F(H(t)-L(t)) of the electric driver (18) and inherent Pockels cell capacitance $C_{PC}$.
3. Applying the control signals H(t) and L(t) to produce the Pockels cell control voltage $V_{PC}$ ($t_2$) and drive the Pockels cell (18) within said time interval $[t_1; t_2]$, preferably in a way that obtains a desired voltage profile during the whole interval $t \in [t_1; t_2]$.

For any Pockels cell driving voltage function $V_{PC}(t)$ within $[t_1; t_2]$, the control signal S(t)=H(t)-L(t) can be found by differentiating it with respect to time:

$$S(t) = H(t) - L(t) = \frac{d(V_{PC}(t))}{dt}$$

The initial Pockels cell driving voltage $V_{PC}^{t_1}$ can be present and known on the terminals of the electric driver (17). Otherwise, if the current $V_{PC}$ is unknown, it has to be reset to $V_{PC}^{t_1}$ by the steps of:
1. Setting $V_{PC}$ value to either +HV, -HV or zero. This can be accomplished by shorting the Pockels cell by applying the corresponding signals or applying a control signal pulse with a sufficiently large amplitude and/or long duration, the control pulse with amplitude $A_4$ and duration $t_4$ sets $V_{PC}=-HV$ in FIG. 6.
2. Driving the Pockels cell voltage $V_{PC}$ with the control signals H(t) and L(t) as described in Step 2 above.

The invention claimed is:
1. A system for arbitrary control of amplitude, or polarization or phase of light in a pulsed laser system, the system comprising at least
an optical layout configured for propagation of laser pulses,
an electro-optical switch which is a Pockels cell responsible for said control of light amplitude or polarization or phase, said Pockels cell is controlled via at least two electric contacts having an electric capacitance in between them,
an electric driver responsible for control of said Pockels cell, said electric driver is configured to control the voltage on the contacts of said Pockels cell by injecting charge into said capacitance utilizing one or more electric current pulses, wherein the electric driver comprises current-switching cells, each switching cell configured as an externally controlled source or a sink of the electric current pulses, wherein each switching cell comprises an input for an external control signal (H,L), and a main current-switching Field-Effect Transistor, FET, wherein the external control signal (H,L) is converted into Pockels cell's controlling current pulses with amplitude and duration substantially related to the amplitude and duration of said external control signal (H,L);
wherein the main FET of each switching cell is supplemented with a linearizing feedback circuit on the current flow path, connected to the source, or between the source and gate terminals of the main FET, for sensing and stabilizing the current flowing through said switching cell;
wherein the Pockels cell's control voltage is set and changed at time intervals between laser pulses, by applying the external control signals (H,L) at the switching cell external control input;
wherein the external control signal (H,L) pulses are provided with variable width or amplitude, or both, thereby converting into corresponding current pulses; and
wherein the width and/or amplitude of the external control signal pulses is provided such that a predefined control voltage of said Pockels cell's is reached within said time intervals between laser pulses.

2. The system according to claim 1, wherein the switching cells of said electric driver are implemented with the separated control signal and power inputs.

3. The system according to claim 1, wherein a switching cells of said electric driver are implemented with a common input for the control signal and power.

4. The system according to claim 1, wherein a switching element of the electric driver comprises a stack of said switching cells with their control inputs tied together, to operate under high voltage wherein the high voltage is not less than the λ/4 voltage of the Pockels cell and the number of switching cells in the stack is such that the operating voltage of the main FET of any switching cell does not exceed its specified maximum operating voltage.

5. The system according to claim 1, wherein said electric driver uses a unipolar topology of switching elements, to drive the Pockels cell.

6. The system according to claim 1, wherein said electric driver uses a bipolar topology of switching elements, to drive the Pockels cell.

7. The system according to claim 1, wherein said electric driver uses a unipolar topology of switching elements, arranged in a way that permits a higher unipolar voltage excursion of the Pockels cell by utilizing a bipolar voltage supply.

8. The system according to claim 1, wherein the system is configured for arbitrary control of polarization, phase, and amplitude of light in pulsed laser systems.

9. A method for arbitrary control of amplitude or polarization or phase of light in a pulsed laser system using a Pockels cell, the method comprising:
   supplying an external control signal (H,L) pulse of a preset duration and amplitude to a selected switching element of an electric driver of the Pockels cel;
   converting the external control signal (H,L) pulse is converted into an electric current pulse having amplitude and duration substantially related to the amplitude and duration of said external control signal pulse, said current pulse flowing through the switching element and the Pockels cell, by charging or discharging
   the capacity of said Pockels cell resulting in the change of the voltage across said Pockels cell, wherein the converting driver of the Pockels cell comprises current-switching cells, each switching cell configured as an externally controlled source or a sink of the electric current pulses, wherein each switching cell comprises an input for an external control signal (H,L), and a main current-switching Field-Effect Transistor, FET, wherein the external control signal (H,L) is converted into Pockels cell's controlling current pulses with amplitude and duration substantially related to the amplitude and duration of said external control signal (H,L);
   wherein the main FET of each switching cell is supplemented with a linearizing feedback circuit on the current flow path, connected to the source, or between the source and gate terminals of the main FET, for sensing and stabilizing the current flowing through said switching cell;
   wherein the Pockels cell's control voltage is set and changed at time intervals between laser pulses, by applying the external control signals (H,L) at the switching cell external control input; and
   wherein the control signal (H,L) pulses are provided with variable width or amplitude, or both, thereby converting into corresponding current pulses.

10. The method according to claim 9, wherein the separate external control signal and power supply are provided to the switching elements having separated control signal and power inputs.

11. The method according to claim 9, wherein only the external control signal is provided to the switching elements having the common input for control signal and power.

12. The method according to claim 9, wherein one or more control signals (H,L) simultaneously supplied to one or more switching elements thereby controlling the unipolar and bipolar topologies of said electric driver, to set the predefined values of control voltage of said Pockels cell.

13. The method according to claim 9, wherein the method is configured for arbitrary control of light's polarization, phase, and amplitude in pulsed laser systems.

14. The system according to claim 1, wherein the linearizing feedback circuit at the terminals of said main FET, is any one of:
   a feedback resistor at the source terminal of the main FET;
   a feedback resistor at the source terminal of the main FET, with an additional depletion-mode FET device;
   a feedback resistor with an additional depletion-mode FET device, and separate power input for the additional FET device;
   a feedback circuit consists of resistors and semiconductor devices, such as bipolar transistors and diodes, measuring the current flowing through the switching cell and modulating it through the FET gate terminal.

15. The method according to claim 9, wherein the control signals (H,L) are arranged to control the Pockels cell modulation for laser pulse bursts as well as single pulses.

* * * * *